United States Patent
Jin et al.

(10) Patent No.: US 7,851,764 B2
(45) Date of Patent: Dec. 14, 2010

(54) METHOD OF HIGH-ENERGY PARTICLE IMAGING BY COMPUTING A DIFFERENCE BETWEEN SAMPLED PIXEL VOLTAGES

(75) Inventors: Liang Jin, La Jolla, CA (US); Robert B. Bilhorn, San Diego, CA (US); Xuong Nguyen-Huu, San Diego, CA (US)

(73) Assignees: Direct Electron, LP, San Diego, CA (US); The Regents of the University of California, Oakland, CA (US)

( * ) Notice: Subject to any disclaimer, the term of this patent is extended or adjusted under 35 U.S.C. 154(b) by 132 days.

(21) Appl. No.: 12/408,586

(22) Filed: Mar. 20, 2009

(65) Prior Publication Data

US 2010/0237252 A1 Sep. 23, 2010

(51) Int. Cl.
*G01T 1/24* (2006.01)
(52) U.S. Cl. .................................. 250/370.08
(58) Field of Classification Search ................. 250/214, 250/1, 310, 311, 370.01, 370.08
See application file for complete search history.

(56) References Cited

U.S. PATENT DOCUMENTS 6,285,018 B1 * 9/2001 Aebi et al. ............... 250/214.1
7,283,166 B1 * 10/2007 Billman ...................... 348/255
2006/0169901 A1 8/2006 Nguyen-Huu

FOREIGN PATENT DOCUMENTS

| WO | 9944358 | | 9/1999 |
| WO | 0106571 | A1 | 1/2001 |
| WO | 2008108734 | A1 | 9/2008 |

OTHER PUBLICATIONS

International Search Report for PCT/US2010/027775. 2 pages.

* cited by examiner

*Primary Examiner*—David P Porta
*Assistant Examiner*—Marcus H Taningco
(74) *Attorney, Agent, or Firm*—Stetina Brunda Garred & Brucker (57) ABSTRACT

A method of high-energy particle imaging by individual particle counting with an active pixel direct bombardment detector. The method includes the step of providing an active pixel direct bombardment detector including an array of pixels. Each pixel is characterized by a reset time constant. The method further includes sampling the pixel voltage of each pixel at a first time. The method further includes applying a pixel reset voltage to each pixel for a reset time interval less than the reset time constant. The method further includes sampling the pixel voltage of each pixel at a second time. The method further includes computing a difference between the sampled pixel voltages at the first and second times. The sampling and the applying of the reset voltage may be periodic. A direct bombardment detector is also provided.

15 Claims, 5 Drawing Sheets

METHOD OF HIGH-ENERGY PARTICLE IMAGING BY COMPUTING A DIFFERENCE BETWEEN SAMPLED PIXEL VOLTAGES

STATEMENT RE: FEDERALLY SPONSORED RESEARCH/DEVELOPMENT

Grant No. NIH P41RR004050—SBIR Phase I entitled A Completely New and Fast Detector for EM, awarded by the National Institutes of Health; and Grant No. 1 R43 RR024964—University research grant entitled—A Completely New and Fast Detector for EM, awarded by the National Institutes of Health.

CROSS-REFERENCE TO RELATED APPLICATIONS

Not Applicable

BACKGROUND

The present invention relates in general to a high-energy particle imaging, and more particularly, to a method of high-energy particle imaging by computing a difference between sampled pixel voltages.

Conventionally, either photographic emulsions or electronic image sensor based cameras using down-converting scintillator screens are used in a transmission electron microscope (TEM). The scintillator (or phosphor) screen converts the impinging electron image into a visible light image that can be recorded with the photon sensitive devices. These existing detection techniques have several drawbacks, such as limited sensitivity, limited resolution, poor usability, and time inefficiency.

Photographic film has been a long-standing standard for electron imaging due to the very high modulation transfer and a large field of view that can be provided. The cumbersome post-acquisition steps associated with film have lead to near complete replacement of the technique, however, by electronic recording methods.

Charged coupled device detectors (CCDs) are now widely used in electron microscopy. These detectors overcome the time-consuming steps of loading, unloading, processing, and digitizing film by providing a digital output directly. Commonly available CCD detectors have formats up to 4096 by 4096 pixels (4K×4K), although they fall short of delivering the full resolution anticipated by the pixel count alone. CCD detectors require the use of a fluorescent scintillation screen to convert the electron image to a photon image. Unfortunately, with each primary electron event, the size of a fluorescent spot produced within the scintillation screen is much larger than the CCD pixel size. Although scintillator material layer thickness can be reduced to minimize the spot size, sensitivity is sacrificed as the number of photons produced per incident electron is also reduced. For example, in electron microscopy at 300 KeV, the full width at half maximum of the spot from a typical scintillator material is about 30 μm. However, the full width at 1% is 200 μm. The large spread of light reduces the effective resolution of the CCD camera, which often has pixels on the order of 15 μm, by at least a factor of two in each dimension, thus rendering the effective resolution of a 4K CCD camera to 2K×2K. This is far less than the resolution achieved by film, which for a 8 by 10 cm sheet is on the order of 8K×10K.8K. Nevertheless, except in rare instances, CCDs have replaced film because of other shortcomings associated with film.

A new type of detector for TEM that overcomes the limitations of scintillators and may deliver, or even exceed, the full resolution of film is disclosed in U.S. Pat. No. 7,262,411 entitled "Direct Collection Transmission Electron Microscopy" the complete contents of which are incorporated herein by reference. A detector based on active pixel sensors is used in direct bombardment mode to achieve direct detection of primary electrons without use of a scintillator screen. This new detector includes a pixel array comprising charge collection diodes that collect secondary electrons generated when a primary electron passes through the thin epitaxial silicon layer in which the p-n junction of the diode is formed. These detectors may achieve relatively high-speed readout, high spatial resolution, and very high sensitivity to single primary electrons.

A drawback of this and many other detectors currently used for electron imaging is that they intrinsically record quantities of energy deposited by the incident particles as they traverse a thin sensing volume in the detector. These thin-section detectors, which happen also to include photographic film and scintillator screens, collect a small fraction of the primary particle energy as it scatters inelastically (losing some energy as it scatters) while passing through the sensing volume.

By contrast, some detectors used in x-ray and high-energy particle detection, rely on completely stopping the particle and collecting all of its energy, by using relatively thick sensing volumes. While these thick detectors can accurately (with relatively low noise) record the energy of the incident particle, they suffer from poor spatial resolution due to the lateral scattering the incident particle can undergo in the sensing volume, and do not prove to be very good imaging detectors. Reducing the sensing volume thickness of the detector improves spatial resolution, but results in lower collected signals in the thin-section detectors. Additionally, the signal in the thin-section detectors is highly variable, due to the fact that the energy deposited by the incident particle in the thin sensing volume varies statistically according to the Landau distribution, which has a long tail extending to high energy (up to the total energy of the incident electron). This varying nature of the deposited energy in the thin-section detectors introduces an additional SNR penalty that is particularly apparent under low dose imaging conditions.

Counting methods have been proposed for use with both bulk detectors (also known as hybrid detectors) and thin-section detectors such as CCDs, active pixel sensors, and strip detectors. Counting avoids the noise associated with integrating methods by simply recording either the presence or absence of an incident electron in a pixel. To be successful however, counting requires very high frame rates if practical electron beam intensities are to be used. Counting methods also afford the opportunity to improve spatial resolution by performing analysis of the cluster of pixels that receive charge from an incident electron.

Conventional read-out methods used with active pixel sensors are considered too slow, however, for large arrays to be used with electron beams of practical intensities. This limitation arises because of the need to clear charge from the array between exposure frames.

Any pixel in an active pixel imaging-sensor is able to detect input signals (from light, electrons, etc.) by integrating ionization electrons in its sensing volume and collecting the total charges in its photodiode. During the pixel reset, the photodiode of each pixel is connected to a reset voltage and the charge in the photodiode is cleared out. At the completion of the reset, the photodiode enters an integration mode and starts to collect ionization electrons that are generated from an external source, such as light or electron illumination.

Figure 1:
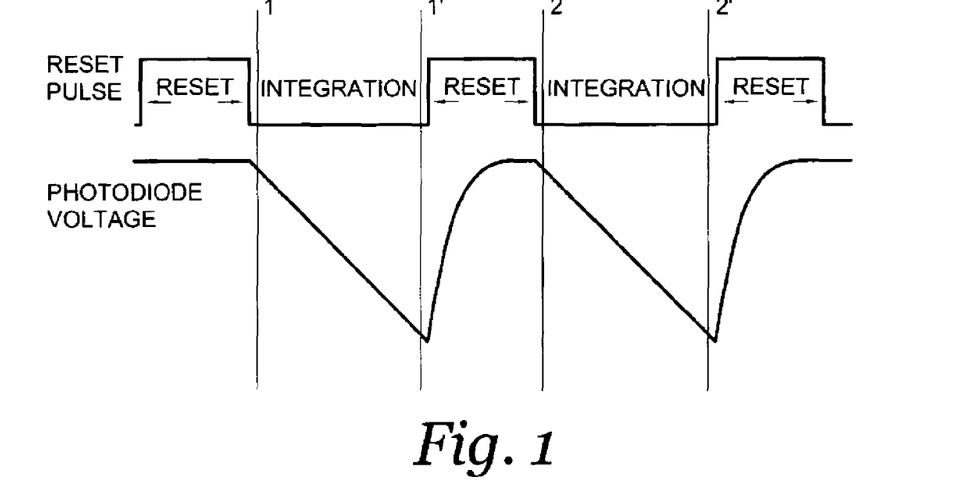
FIG. 1 is a symbolic illustration of a photodiode voltage response profile of a single pixel to a constant external signal input (constant illumination) and a reset pulse profile (with photodiode voltage represented along the vertical axis and time represented along the horizontal axis)

Referring now to FIG. 1 there is depicted a symbolic illustration of a photodiode voltage response profile of a single pixel to a constant external signal input (constant illumination) and a reset pulse profile (with photodiode voltage represented along the vertical axis and time represented along the horizontal axis). The external signal drives the diode voltage down linearly with increasing integration time. When the pixel is reset again, the voltage recovers (exponentially) and returns back to the reset level. It is noted that the voltage may actually be driven up (depending upon the particular pixel design setup utilized).

Referring now to FIG. 1, a prior art method to read such a sensor is to sample the voltage output of the photodiode (also referred to as photodiode voltage and pixel voltage) at the end of each integration period such as at time points as indicated at time instances 1' and 2'. Another prior art readout method is to sample the voltage both at the beginning and end of each integration period (time instances 1, 1', and 2, 2'). The latter readout method is often called Correlated Double Sampling (CDS), because for each pixel reset the photodiode voltage is sampled twice and only the difference between the two sampled voltages is used for the final image. The CDS method effectively eliminates the reset noise (kTc noise), thus is a preferred method for low-noise applications.

Figure 2:
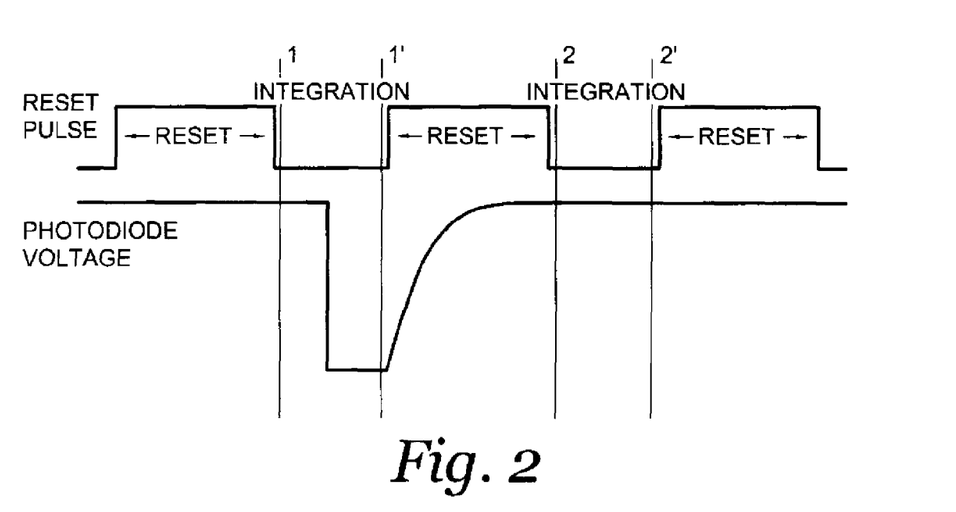
FIG. 2 is a symbolic of a photodiode voltage response profile of a single pixel when an incident electron hits the pixel, and a reset pulse profile (with photodiode voltage represented along the vertical axis and time represented along the horizontal axis)

In the electron counting case, a single electron strikes a pixel and deposits a quantity of charge almost instantaneously. Referring now to FIG. 2 there is depicted a symbolic illustration of a photodiode voltage response profile resulting when an incident electron hit the pixel and a reset pulse profile (with photodiode voltage represented along the vertical axis and time represented along the horizontal axis). FIG. 2 shows the photodiode voltage profile when an incident electron hits the pixel in the middle of the integration time period after the first reset pulse. The photodiode voltage drops down to the low level after the electron hit (as indicated at a time instance in the middle of the integration time interval between time instances 1 and 1'), and it only begins to recover when the next pixel reset is asserted Oust after the time instance 1').

Figure 3:
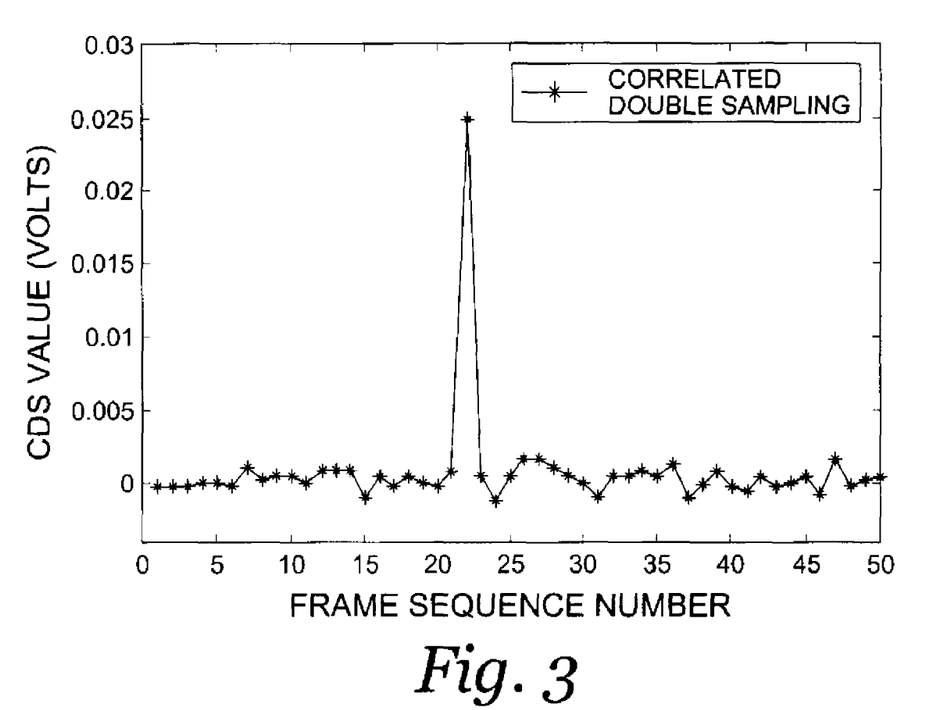
FIG. 3 is a sample plot of voltage values of a video output recorded from a single pixel using the CDS method as plotted over the course of 50 frames, with the peak corresponding to an incident electron hit.

Referring now to FIG. 3 there is depicted a sample plot of voltage values of a video output recorded from a single pixel using the CDS method as plotted over the course of 50 frames. A high-energy electron event is easily observed in frame 22. The CDS method requires two reads for each frame and a relatively long reset period, to ensure accurate quantification of the signal charge collected.

As illustrated by both FIG. 1 and FIG. 2, the voltage recovery process that occurs during the assertion of the pixel reset follows an exponential curve characterized by a reset time constant. The reset time constant is specific to the device design and is associated with the reset voltage, resistance, and capacitance of the circuitry. The reset time constant can become particularly problematic in large arrays and in some cases can require reset periods as long 10 to 30 microseconds. In high frame rate applications, such as electron counting for TEM, this time constant can become an important bottleneck to attaining high frame rates.

Accordingly, there exists a need in the art for an improved high-energy particle imaging used with an active pixel direct bombardment detector in comparison to the prior art.

BRIEF SUMMARY

According to an aspect of the present invention, there is provided a method of high-energy particle imaging by particle counting with an active pixel direct bombardment detector. The method includes the step of providing an active pixel direct bombardment detector including an array of pixels. Each pixel is characterized by a reset time constant. The method further includes sampling the pixel voltage of each pixel at a first time. The method further includes applying a pixel reset voltage to each pixel for a reset time interval less than the reset time constant. The method further includes sampling the pixel voltage of each pixel at a second time. The method further includes computing a difference between the sampled pixel voltages at the first and second times to detect a particle interaction event occurring between the first and second times.

According to various embodiments, the array of pixels is a 2D array. The direct bombardment detector may be an electron detector. The electron detector may include a sensing volume with a dimension parallel to an incident radiation beam less than 50 microns, or even less than 15 microns. The applying of the pixel reset voltage may include sending a reset pulse to control a reset switch connected to a reset voltage to selectively connect each pixel to the reset voltage. The reset time constant may be approximately a time interval necessary for each pixel, in response to the reset voltage, to reach approx 63% of its final asymptotic voltage across the pixel. The computing of the difference may include comparing analog or digital signals of the sampled pixel voltages.

According to an aspect of the present invention, there is provided a method of high-energy particle imaging by particle counting with an active pixel direct bombardment detector. The method includes the step of providing an active pixel direct bombardment detector including an array of pixels. Each pixel is characterized by a reset time constant. The method further includes sampling the pixel voltage of each pixel at a first time. The method further includes applying a pixel reset voltage to each pixel for a reset time interval less than the reset time constant. The method further includes sampling the pixel voltage of each pixel at a second time. The method further includes detecting a particle interaction with a given pixel using a difference between the sampled pixel voltages at the first and second times for such given pixel.

According to another aspect of the present invention, there is provided a method of high-energy particle imaging by particle counting with an active pixel direct bombardment detector. The method includes providing an active pixel direct bombardment detector including an array of pixels. Each pixel is characterized by a reset time constant. The method further includes periodically applying a pixel reset voltage to each pixel for a reset time interval less than the reset time constant. The method further includes periodically sampling the pixel voltage of each pixel subsequent to each periodic application of the pixel reset voltage to each pixel. The method further includes computing a difference between each sampled pixel voltage and each immediately subsequent sampled pixel voltage to detect a particle interaction event occurring between the sampling of compared pixel voltages.

According to yet another aspect of the invention there is provided a direct bombardment detector for high-energy particle imaging for use with a radiation beam. The detector includes an array of pixels. Each pixel characterized by a reset time constant. The array is positionable with the radiation beam being incident upon the array of pixels. The detector further includes a reset voltage. The detector further includes a reset switch connected to the reset voltage and each pixel, the reset switch being configured to selectively connect each pixel to the reset voltage for a reset time interval less than the reset time constant in response to the a reset pulse The detector further includes a sampling device configured to sample the pixel voltage of each pixel at a first time prior to connection of each pixel to the reset voltage and at a second time after connection of each pixel to the reset voltage. The detector further includes a control device configured to compute a difference between the sampled pixel voltages at the first and second times. Further, the detector may be an electron detector. The detector may further include a sensing volume with a dimension parallel to the incident radiation beam less than 50 microns, or even less than 15 microns.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description set forth below in connection with the appended drawings is intended as a description of the presently preferred embodiment of the invention, and is not intended to represent the only form in which the present invention may be constructed or utilized. Reference throughout the detailed description to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this detailed description are not necessarily all referring to the same embodiment. The following description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments. In the following description, numerous specific details are shown to provide a thorough understanding of embodiments of the invention. One skilled in the relevant art will recognize, however, that the invention may be practiced without one or more of the specific details, or with other methods, components, materials, etc. In other instances, well-known structures, materials, or operations are not shown or described to avoid obscuring aspects of the invention. It is further understood that the use of relational terms such as first and second, and the like are used solely to distinguish one from another entity without necessarily requiring or implying any actual such relationship or order between such entities.

Direct bombardment detectors in electron microscopy offer a number of significant advantages over traditional means of detection and imaging. By direct bombardment detection, primary image-forming electrons may be detected by impinging these electrons directly on a pixelated detector without the use of any intervening energy down-conversion techniques. The impinging electrons deposit some of their energy in the detector in the form of a cloud of secondary electrons. The cloud of secondary electrons is then detected by techniques commonly used in optical image sensors such as CCDs or CMOS image sensors. The advantages of direct bombardment detection may include high sensitivity, for example, detection of individual primary electron with a signal-to-noise ratio (SNR) over 10, and improved spatial resolution. Direct bombardment detection also offers relatively increased speed of image data acquisition through high operation rates and large-scale integration of read-out and digitization functions.

The advantages described above may be realized in a number of ways in electron microscopy. For example, the very high sensitivity and high spatial resolution are of particular benefit for determination of structure and conformation of highly sensitive sample specimens such as biological materials. The benefit of high sensitivity translates into relatively lower electron dose on the sample for a given SNR in the image. The higher spatial resolution can also be used to reduce the total sample dose. With a direct detector, lower microscope magnification is required to achieve the same resolution as a detector with poorer spatial resolution. Lower magnification operating points tend to reduce dose on the sample and confer additional advantages such as improved stability.

Direct bombardment detection may further offer advantages beyond dose reduction for use with electron beam sensitive and other unstable materials in electron microscopy. These advantages arise from the method of operation of a direct bombardment detector. Unlike traditional detectors such as CCDs and CMOS image sensors that accumulate photo-generated charges in their pixels prior to the read-out of an image frame, direct bombardment detectors tend to read out much faster and more frequently. This is possible because of their high single primary electron sensitivity which provides high readout speed without the penalty of introducing unacceptable levels of readout noise in each frame.

Counting with a direct bombardment detector is achieved by operating the imager at very high frame rates thereby drastically reducing the number of recorded primary electrons per frame. This may also be done in concert with reducing the electron beam intensity. In this "sparse" readout process, each primary electron produces secondary charge in a small and distinct cluster of pixels whose signal (in analogto-digital converter units—ADCs) exceeds the background (unexposed) signal level (noise level) by an amount that allows detection with high confidence (high SNR). Cluster centers are recorded as high-energy electron interaction events in a separate accumulation memory. By not integrating charge, the wide statistical variation in the amount of charge produced by individual interactions no longer degrades the SNR of the resulting image. Similarly, by recording only the cluster center (rather than integrating charge from a cluster of pixels) the spatial resolution of the resulting image is improved. Key to the success of this method is the ability to achieve sufficiently high frame rates to avoid interaction "pile-up" while operating at practically useful beam intensities.

To achieve the fast readout speed required for a large format direct bombardment detector to be used at convenient beam intensities in TEM while maintaining high detection efficiency and signal to noise ratio, several strategies are employed in the digitization and readout process.

A first strategy for fast readout is to incorporate Analog-to-Digital Converters (ADCs) into the design of the sensor itself. This avoids the need to bring analog signals off of the chip for digitization in external circuits. External digitization becomes especially cumbersome when many parallel outputs are required in order to decrease frame time (increase readout speed). CMOS image sensor designs are known to incorporate a digitization circuit for each row (or column) in a 2-dimensional array. The counting mode of the direct bombardment detector be implemented with many parallel digitization circuits (currently one per column).

Digitization precision (number of bits used to represent output voltage) is also optimized to maximize readout speed in counting mode. Because the counting method does not rely on an extremely accurate measurement of the deposited energy, the counting direct bombardment detector can digitize the signal to fewer bits and retain the same performance. A single bit can record the presence or absence of an event in a pixel. More bits of precision are required, for example, to implement centroid algorithms for achieving sub-pixel resolution. Digitizing to lower, user settable precision in the direct bombardment detector significantly reduces the digitization time (requiring less conversion clocks), and allows more pixel values to be packed and transferred off the chip within a given bandwidth limitation for data transfer. The tradeoff between using fewer bits (higher quantization noise) and sensitivity to events that deposit small quantities of charge can be optimized based on sensor parameters and the energy of the incident high-energy particle beam.

Additional strategies for increasing and optimizing the readout rate of the counting for a direct bombardment detector involve the signal sampling methods. As discussed above, it is well known in the art to use Correlated Double Sampling (CDS). The method uses two sequential reads of the sensor array, the first immediately following reset of the sensing diodes, and the second following a predefined integration period. Subtraction of the two values obtained for each pixel results in a signal value free of variations in pixel offset (fixed pattern noise) and reset noise (kTC noise).

According to aspects of the present invention, there is provided a readout method to increase the readout speed of an imaging sensor for the detection of high-energy electron or other particle hits. As discussed above, the reset time constant for the pixel voltage can be a bottleneck limiting the highest frame rate of the sensor. To increase the frame rate beyond the limit of the reset time constant means that the reset will be insufficient and the voltage of the photodiode will not return back to the original dark level.

Figure 4:
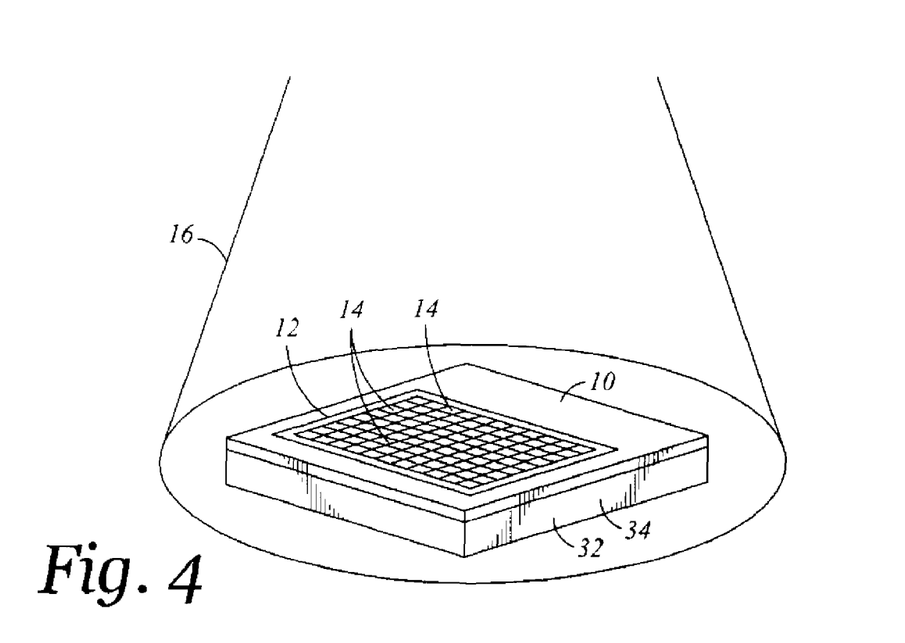
FIG. 4 is a direct bombardment detector having an active pixel array with an incident radiation beam.

According to an aspect of the present invention, there is provided a method of high-energy particle imaging by particle counting with an active pixel direct bombardment detector, such as the active pixel direct bombardment detector 10. Referring now to FIG. 4 there is depicted a detector 10 having an array of pixels 12 (with individual pixels denoted as pixels 14) with an incident radiation beam 16. The detector 10 may take the form of any of those devices which are well known to one of ordinary skill in the art. For example, where the detector 10 may be an electron detector. Other detectors may be configured to sense protons, neutrons, and other subatomic particles, x-rays and other ionizing radiation according to those which are well know to one of ordinary skill in the art. The detector 10 may have a design in accordance with those teachings of U.S. Pat. No. 7,262,411 entitled "Direct Collection Transmission Electron Microscopy" the complete contents of which are incorporated herein by reference. As such, the detector 10 may be based on active pixel sensors used in direct bombardment mode to achieve direct detection of primary electrons without use of a scintillator screen. The detector 10 may include an active pixel array comprising charge collection diodes that collect secondary electrons generated when a primary electron passes through the thin epitaxial silicon layer in which the p-n junction of each diode is formed. In addition, while the array of pixels 12 is illustrated as a 2D array, it is contemplated that the array of pixels may be a single row type, 3D or other dimensional configuration.

The method includes the step of providing an active pixel direct bombardment detector 10 including the array of pixels 12. Each pixel 14 is characterized by a reset time constant. The method further includes sampling the pixel voltage of each pixel 14 at a first time. The method further includes applying a pixel reset voltage to each pixel 14 for a reset time interval less than the reset time constant. The method further includes sampling the pixel voltage of each pixel 14 at a second time. The method further includes computing a difference between the sampled pixel voltages at the first and second times to detect a particle interaction event occurring between the first and second times.

Figure 5:
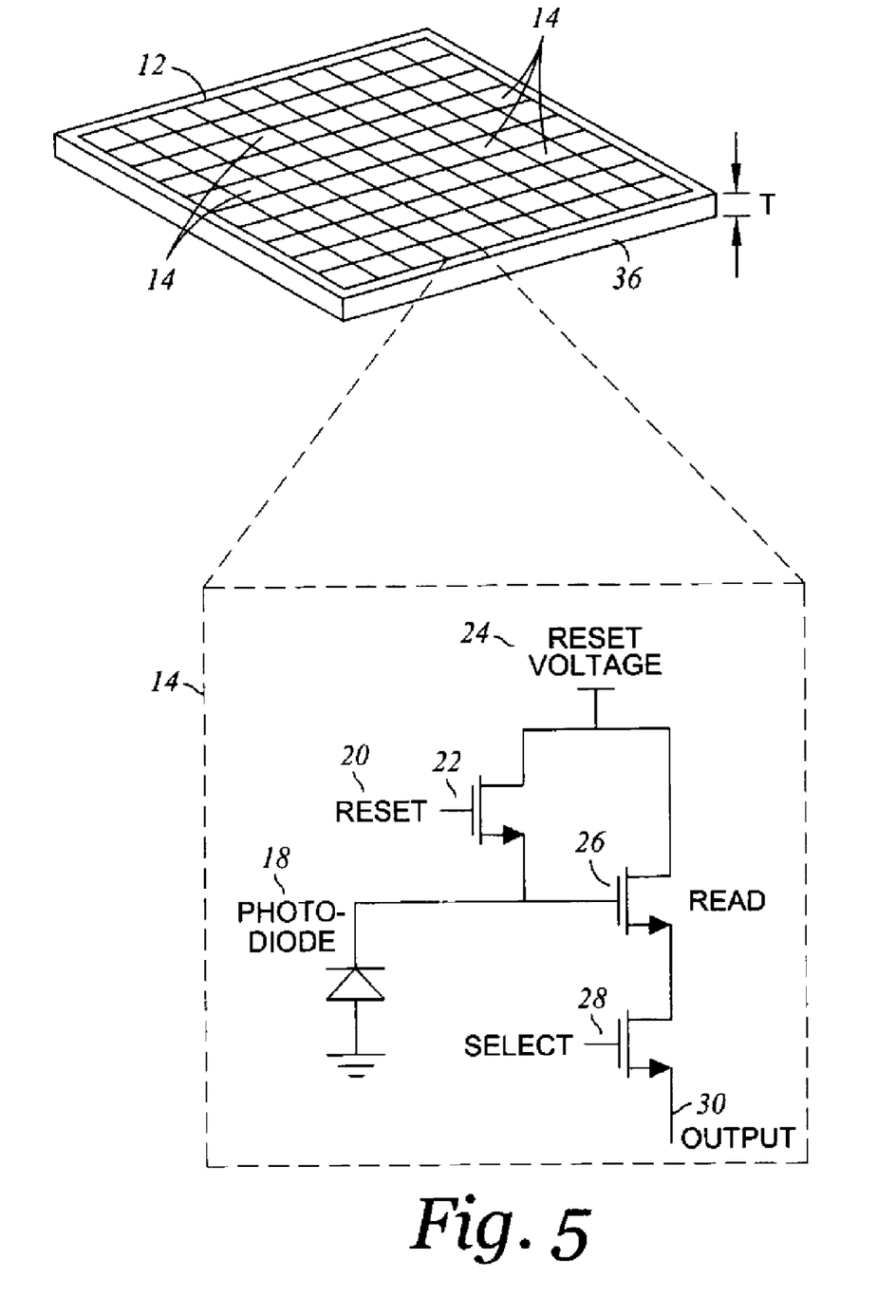
FIG. 5 is a perspective view of the active pixel array of FIG. 4 with a selected pixel illustrated as enlarged with electrical components symbolically indicated.

Referring now to FIG. 5 there is depicted a perspective view of the array of pixels 12 of FIG. 4 with a selected pixel 14 illustrated as enlarged with electrical components symbolically indicated. In the particular embodiment illustrated the pixel 14 includes a photodiode 18, a reset switch 20 (in the form of a reset transistor 22), a pixel reset voltage 24, a read transistor 26, a select transistor 28, and an output 30. As one of ordinary skill in the art will recognize, this arrangement is a simple 3T (3 transistor) arrangement with the reset switch 22 being used to connect the photodiode 18 to the reset voltage 24 and the output 30 being used to sense the pixel voltage, and more particularly the photodiode voltage representing an accumulated charge. As one of ordinary skill in the art will further understand, the pixel 14 of the present invention may be implemented with other electrical components and configurations, such as with 4T or 5T designs. The value of the reset voltage 24 is chosen, as is well know to one of ordinary skill in the art, so as to effectively optimize the performance of the sensor or detector with respect to various specifications, such as dynamic range for example, while staying within a safe margin of the maximum operating capabilities of the device.

The detector 10 may further include a control device 32 and a sampling device 34. The control device 32 and sampling device 34 may be integrated into a single overall electrical component. The reset switch 22 is controlled by the control device 32. The pixel reset voltage 24 may be applied to the pixel 14, and more specifically to the photodiode 18, by sending a reset pulse to control the reset switch 22 connected to a reset voltage 24 to selectively connect each pixel to the reset voltage 24. The output 30 is connected to the sampling device 24 for sensing the pixel voltage associated with the photodiode 18. In this regard, one of ordinary skill in the art will recognize that other electronic components connected to the output 30 may include an amplifier and an analog-to-digital converter.

In addition, the detector 10 may include a sensing volume 36 with a dimension (T) parallel to an incident radiation beam less than 50 microns. Preferably, the dimension T is less than 15 microns. Such a thin layer may be used to avoid collecting charge from primary particle interactions from deep within the device that would tend to reduce spatial resolution.

Figure 6:
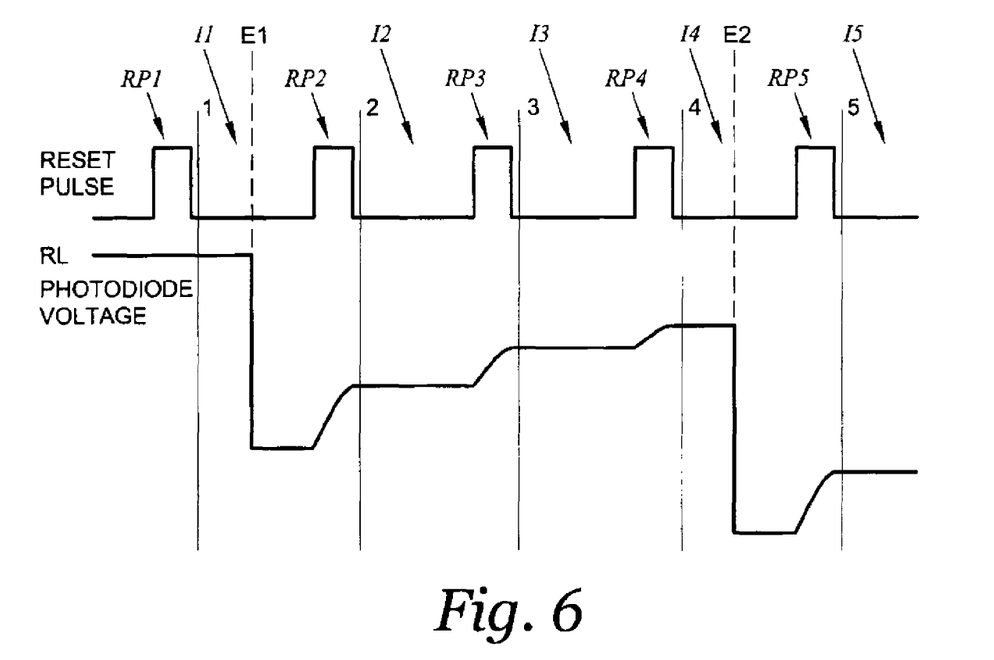
FIG. 6 is a symbolic of a photodiode voltage response profile of a single pixel resulting when an incident electron hits the pixel at a first time instance and another electron hits the pixel as a later time instance, and a reset pulse profile (with photodiode voltage represented along the vertical axis and time represented along the horizontal axis)

FIG. 6 is a symbolic of a photodiode voltage response profile of a single pixel, such as pixel 14 resulting when an incident electron hits the pixel at a first time instance and another electron hits the pixel as a later time instance, and a reset pulse profile (with photodiode voltage represented along the vertical axis and time represented along the horizontal axis). FIG. 6 represents a sample illustration of an implementation of the method according to an aspect of the present invention. The top curve is the reset pulse profile. As is shown, the reset pulse profile includes five periodic reset pulses, individually denoted RP1, RP2, RP3, RP4 and RP5. Each of the reset pulses extends over a reset time interval. The reset pulses repeat in equal intervals and the reset time intervals are likewise equal. Immediately following each of the reset pulses RP1-5 are integration time intervals, individually denoted as I1, I2, I3, I4 and I5.

Referring now to the lower curve representing the photodiode voltage response profile, the photodiode voltage or pixel voltage is at an initial state of the reset voltage level, designated RL. Just subsequent to the reset pulse RP1 at time instance 1 the pixel voltage is sampled. This likewise occurs periodically after each of the other reset pulses RP2-5 at time instances 2-5. It is contemplated that such sampling may occur in close temporal proximity to the end of each reset pulse. However, such sampling is to be effectuated consistently at whatever time lag in comparison to each reset pulse. It is noted that sampling of the pixel voltages occurs in the context of an overall readout process and readout time interval. (frame time). It is contemplated that the multiple pixels 14 that make up a multi-dimensional array of pixels 12 may be reset and sampled sequentially, in parallel, or some combination of the two.

Approximately at the middle portion of the integration time interval I1, there is indicated an interaction event E1. This corresponds to a first external signal hit or high-energy particle hitting the photodiode 18. This results in the photodiode or pixel voltage to drop down from the initial reset voltage level RL. Subsequently, reset pulses RP2, RP3 and RP4 expose the photodiode 18 to the pixel reset voltage 24. However, as mentioned above, the method includes applying a pixel reset voltage to each pixel 14 for a reset time interval less than the reset time constant. Subsequent to the interaction event E1, the reset pulse RP2 results in the application of the pixel reset voltage 24 for a reset time interval less than the reset time constant.

As is illustrated, after the reset pulse RP2 at the time instance 2, the sampled pixel voltage is well below the reset voltage level RL. This is because the reset time interval in the new method is not sufficiently long enough to allow the pixel voltage to approach the pixel reset voltage 24. In fact, the reset time interval is significantly shorter than the reset time constant, which is the time interval necessary for each pixel response to the reset voltage to reach approximately 63% of its final asymptotic value. Even after additional reset pulses RP3 and RP4, the pixel voltage has still just recovered to about half of the initial voltage level RL. Thus at time instance 14, the pixel 14, and more specifically the photodiode 18, is only partially reset. In this regard, it is understood that in order for the pixel 14 to be fully reset by a single reset pulse, such a reset pulse would have to have a reset time interval much longer than that plotted in FIG. 6. It is understood that in prior art methods, one would desire to set the reset time interval to at least three times the reset time constant to allow the photodiode to be fully reset within some margin of acceptability.

As mentioned above, the method of the present invention includes sampling the pixel voltage at a first time and at a second time following a reset, such as at time instances 1 and 2 in FIG. 6. In between these two samplings, the interaction event E1 occurred. A significant difference between the two sampled pixel voltages is apparent. In contrast, the difference between subsequent sampled pixel voltages (e.g., the difference between sample pixel voltages at time instances 2 and 3, and the difference between sample pixel voltages at time instances 3 and 4) are similar and in any case much less than the difference associated with the time interval or frame between time instances 1 and 2 during which the interaction event E1 was observed.

Approximately at the middle portion of the integration time interval 14, there is indicated an interaction event E2. This corresponds to a second external signal hit or high-energy particle hitting the pixel 14. This causes the photodiode or pixel voltage to drop down to a level even lower than as was recorded at the first interaction event E1. Subsequently, the reset pulse RP5 exposes the photodiode 18 to the pixel reset voltage 24. The difference between pixel voltages sampled at time instances 4 and 5 may be computed and such difference is much larger than the differences between sampled voltages associated with time intervals between time instances 2 and 3, and 3 and 4. This spike in difference allows for the determination that another interaction event E2 has occurred. This is accomplished without having to fully reset the pixel 14. Computing the difference between pixel voltages sampled in sequential frames can be carried out in any number of ways including both analog subtraction and subtraction of digital values. Similarly, these steps could be effectuated entirely within detector 10, in hardware, firmware, software or any combination of the foregoing. The computing of the difference may be achieved through a comparison of analog or digital signals of the pixel voltages.

The method of the present invention recognizes that the difference between sequentially taken samples interleaved between relatively short pixel reset pulses can be used to detect the external signal event. The present method does not require the full reset of the pixel 14. Therefore, the method is not limited by the reset time constant, as are other prior art methods. Additionally, only one sample is needed after each reset, which makes the readout process even faster than the conventional methods that require two samples after each reset. (such as CDS and pseudo-CDS methods)

Figure 7:
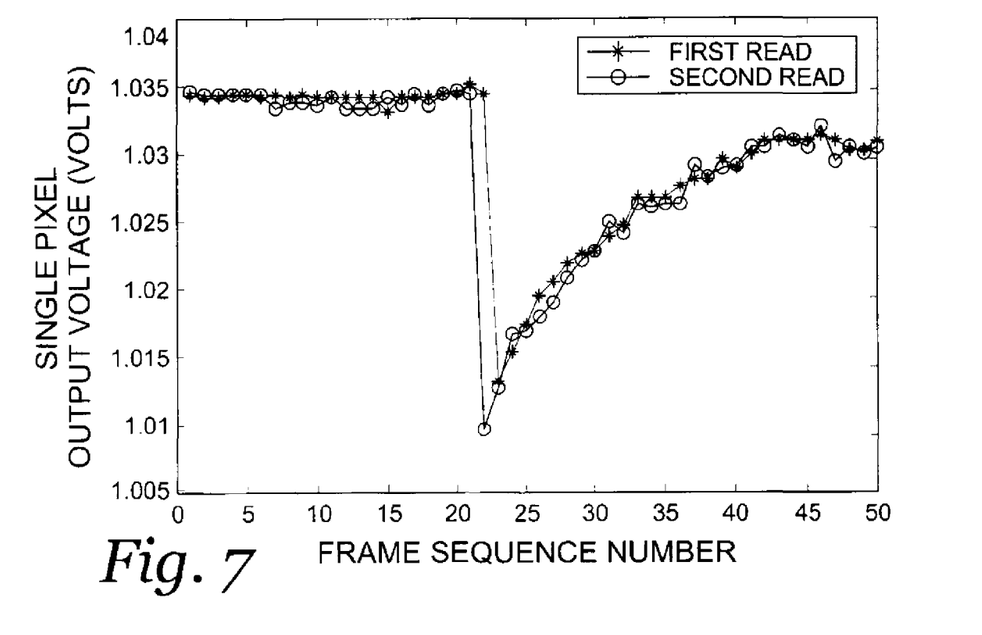
FIG. 7 a sample plot of voltage values of a video output recorded from a single pixel as plotted over the course of 50 frames with curves for a first sampling and a subsequent sampling.
Figure 8:
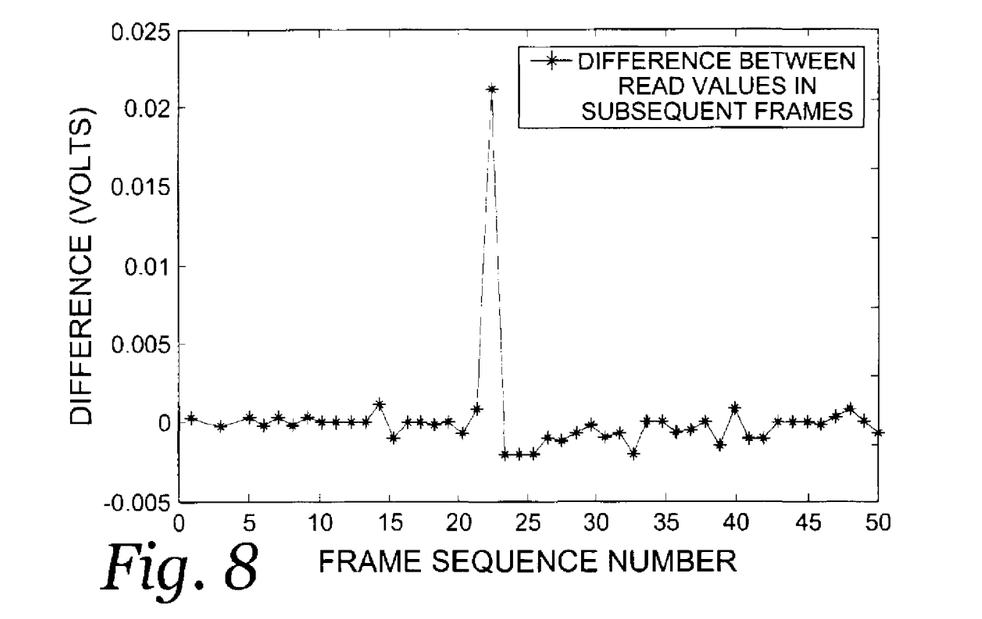
FIG. 8 is a sample plot of differences of voltage values corresponding to the data of FIG. 7 of the video output recorded from a single pixel as plotted over the course of 50 frames, with the detected peak corresponding to an incident electron hit.

Referring now to FIG. 7 there is depicted a sample plot of voltage values of a video output recorded from a single pixel as plotted over the course of 50 frames with curves for a first sampling and a subsequent sampling., the first sampling being taken shortly after a relatively short reset pulse and the second sampling being just before application of the next reset pulse. Referring to FIG. 8 there is depicted a sample plot of differences of voltage values corresponding to the first read data of FIG. 7. This data is the video output recorded from a single pixel using the single difference read method of the present invention as plotted over the course of 50 frames.

FIG. 7 shows sampled pixel voltages recorded for a pixel 14 before and after the integration period for a series of 50 frames around the detection of a particle event in one frame when the reset pulse is significantly shortened. The particle hit the pixel in the 22nd frame (after the first read, but before the second read) and the charge generated in the pixel reduced the output voltage that was sampled (discharged the photodiode). At the start of the next frame (23rd frame), the pixel 14 was reset with a short reset pulse that only partially re-charged the photodiode. Subsequent resets in following frames continue to partially recharge the photodiode until after approximately 20 frames the diode is approaching a fully recharged state. Thus, in this example, the reset time interval is less than $1/20^{th}$ that required to fully reset the photodiode 18.

Referring again to FIG. 7, there is depicted a sample plot of voltage values of a video output recorded from a single pixel as plotted over the course of 50 frames with curves for a first sampling and an immediate subsequent sampling. From examination of FIG. 7, both the first and second reads of a pixel 14 in frames following the interaction result in voltages that track each other to the fully recovered state. This suggests that it is possible to use only the first (or second) reads to identify the occurrence of a particle interaction. Any negative spike in output voltage followed by a recovery showing the characteristic reset time constant is indicative of a particle interaction event. The "single read difference method" of the present invention uses only the difference between the sampled voltages of the first (or second) reads in sequential frames to detect an incident particle hit. That is, the second (or first) reads are not used and those samples are not actually taken. The data is only shown in FIG. 7 for illustrative purposes.

To further illustrate this method, the difference values for the first reads in the series of sequential frames shown in FIG. 7 are presented in FIG. 8. FIG. 8 depicts a sample plot of differences of sample voltages corresponding to the data of FIG. 7 of the video output recorded from a single pixel as plotted over the course of 50 frames. FIG. 8 demonstrates that it is possible to detect the incident particle events using only the difference between the sampled voltages of first reads in sequential frames. Due to the abbreviated pixel reset, the detected peak value in the method is smaller as compared to that obtained with prior art methods. The duration of each reset pulse (reset time interval), given the time constant characteristics of the particular detector, the pixel sensitivity, noise level, particle energy, frame time, and other factors may be adjusted so as to be optimized for counting. Obviously this method is not suitable for charge integration methods, where a measure of the precise quantity of charge generated is desired, because charge detection is not quantitative. However, because the method only requires single reads near the start of the recovery curve, the time between a pixel reset and the subsequent read can be extremely short. The method is ultimately limited to particle arrival rates that allow sufficient recovery of the reset level to make subsequent events detectable. Furthermore, it is contemplated that the present invention may include signal-processing facilities (i.e. FPGA) at or very near the detector chip to carry out the detection and counting operations disclosed here in real-time. This capability allows large arrays (>>2K by 2K) to be used at high frame rates (>100 frames per second) without exceeding the data handling and storage capabilities of ordinary laboratory computers.

According to another aspect of the present invention, there is provided a method of high-energy particle imaging by particle counting with an active pixel direct bombardment detector, such as detector 10. The method includes providing the active pixel direct bombardment detector 10 including an array of pixels 12. Each pixel 14 is characterized by a reset time constant. The method further includes periodically applying a pixel reset voltage to each pixel 14 for a reset time interval less than the reset time constant. The method further includes periodically sampling the pixel voltage of each pixel 14 subsequent to each periodic application of the pixel reset voltage to each pixel 14. The method further includes computing a difference between each sampled pixel voltage and each immediately subsequent sampled pixel voltage to detect a particle interaction event occurring between the sampling of compared pixel voltages.

According to another aspect of the present invention there is provided a direct bombardment detector 10 for high-energy particle imaging for use with the radiation beam 16. The detector 10 includes the array of pixels 12. Each pixel 14 is characterized by a reset time constant. The array of pixels 12 is positionable with the radiation beam 16 being incident upon the array of pixels 12. The detector 10 further includes the reset voltage 24. The detector 10 further includes the reset switch 20 connected to the reset voltage 24 and each pixel 14. The reset switch 20 is configured to selectively connect each pixel 14 to the reset voltage 24 for a reset time interval less than the reset time constant in response to a reset pulse. The detector 10 further includes the sampling device 34 that is configured to sample the pixel voltage of each pixel 14 at a first time prior to connection of each pixel 14 to the reset voltage 24 and at a second time after connection of each pixel 14 to the reset voltage 24. The detector 10 further includes the control device 32 that is configured to compute a difference between the sampled pixel voltages at the first and second times.

What is claimed is:

1. A method of high-energy particle imaging by particle counting with an active pixel direct bombardment detector, the method comprising the steps of:

providing an active pixel direct bombardment detector including an array of pixels, each pixel characterized by a reset time constant;

sampling the pixel voltage of each pixel at a first time;

applying a pixel reset voltage to each pixel for a reset time interval less than the reset time constant;

sampling the pixel voltage of each pixel at a second time, and computing a difference between the sampled pixel voltages at the first and second times to detect a particle interaction event occurring between the first and second times.

2. The method of claim 1 wherein the array of pixels is a 2D array.

3. The method of claim 1 wherein the direct bombardment detector is an electron detector.

4. The method of claim 3 wherein the electron detector includes a sensing volume with a dimension parallel to an incident radiation beam less than 50 microns.

5. The method of claim 4 wherein the sensing volume has a dimension parallel to an incident radiation beam less than 15 microns.

6. The method of claim 1 wherein the applying of the pixel reset voltage includes sending a reset pulse to control a reset switch connected to a reset voltage to selectively connect each pixel to the reset voltage.

7. The method of claim 6 wherein the reset time constant is approximately a time interval necessary for a voltage response of each pixel to the reset voltage to reach approximately 63% of its final asymptotic value.

8. The method of claim 1 wherein the computing of the difference includes comparing analog signals of the sampled pixel voltages.

9. The method of claim 1 wherein the computing of the difference includes comparing digital signals of the sampled pixel voltages.

10. A method of high-energy particle imaging by particle counting with an active pixel direct bombardment detector, the method comprising the steps of:
   providing an active pixel direct bombardment detector including an array of pixels, each pixel characterized by a reset time constant;
   sampling the pixel voltage of each pixel at a first time;
   applying a pixel reset voltage to each pixel for a reset time interval less than the reset time constant;
   sampling the pixel voltage of each pixel at a second time, and
   detecting a particle interaction with a given pixel using a difference between the sampled pixel voltages at the first and second times for such given pixel.

11. A method of high-energy particle imaging by particle counting with an active pixel direct bombardment detector, the method comprising the steps of:
   providing an active pixel direct bombardment detector including an array of pixels, each pixel characterized by a reset time constant;
   periodically applying a pixel reset voltage to each pixel for a reset time interval less than the reset time constant;
   periodically sampling the pixel voltage of each pixel subsequent to each periodic application of the pixel reset voltage to each pixel;
   computing a difference between each sampled pixel voltage and each immediately subsequent sampled pixel voltage to detect a particle interaction event occurring between the sampling of compared pixel voltages.

12. A direct bombardment detector for high-energy particle imaging for use with a radiation beam, the detector comprising:
   an array of pixels, each pixel characterized by a reset time constant; the array of pixels being positionable with the radiation beam being incident upon the array of pixels;
   a reset voltage;
   a reset switch connected to the reset voltage and each pixel, the reset switch being configured to selectively connect each pixel to the reset voltage for a reset time interval less than the reset time constant in response to the a reset pulse;
   a sampling device configured to sample the pixel voltage of each pixel at a first time prior to connection of each pixel to the reset voltage and at a second time after connection of each pixel to the reset voltage; and
   a control device configured to compute a difference between the sampled pixel voltages at the first and second times.

13. The detector of claim 11 wherein the direct bombardment detector is an electron detector.

14. The detector of claim 12 further includes a sensing volume with a dimension parallel to the incident radiation beam less than 50 microns.

15. The detector of claim 14 wherein the sensing volume has a dimension parallel to an incident radiation beam less than 15 microns.

* * * * *